(12) United States Patent
Shin et al.

(10) Patent No.: US 8,089,445 B2
(45) Date of Patent: Jan. 3, 2012

(54) DISPLAY APPARATUS

(75) Inventors: Kyoung-Ju Shin, Gyeonggi-do (KR); Chong-Chul Chai, Seoul (KR); Joo-Ae Youn, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 1079 days.

(21) Appl. No.: 11/695,475

(22) Filed: Apr. 2, 2007

(65) Prior Publication Data

US 2007/0235803 A1 Oct. 11, 2007

(30) Foreign Application Priority Data

Apr. 10, 2006 (KR) ........................ 10-2006-0032296

(51) Int. Cl.
*G09G 3/36* (2006.01)
(52) U.S. Cl. ............... 345/92; 345/87; 345/98; 345/204
(58) Field of Classification Search ............ 345/87–100, 345/204
See application file for complete search history.

(56) References Cited

U.S. PATENT DOCUMENTS

| | | | |
|---|---|---|---|
| 5,949,398 A * | 9/1999 | Kim ............................. | 345/100 |
| 6,462,723 B1 * | 10/2002 | Yamazaki et al. ............. | 345/82 |
| 6,960,787 B2 | 11/2005 | Yamazaki et al. | |
| 2003/0001832 A1 * | 1/2003 | Yamazaki et al. ............ | 345/204 |
| 2004/0080481 A1 * | 4/2004 | Yamazaki et al. ............ | 345/92 |
| 2005/0158929 A1 * | 7/2005 | Yamazaki et al. ............ | 438/166 |
| 2005/0199881 A1 * | 9/2005 | Hoffman et al. ................ | 257/72 |
| 2006/0068532 A1 * | 3/2006 | Schuele et al. ................ | 438/149 |

FOREIGN PATENT DOCUMENTS

| | | |
|---|---|---|
| JP | 2002-033481 | 1/2002 |
| KR | 1997-0009143 | 3/1997 |

* cited by examiner

*Primary Examiner* — Alexander Eisen
*Assistant Examiner* — Viet Pham
(74) *Attorney, Agent, or Firm* — Innovation Counsel LLP

(57) ABSTRACT

A display apparatus includes a switching element having a first gate electrode, a source and drain electrode, a channel area formed between the source and drain electrode, and a second gate electrode. The second gate electrode is electrically insulated from the first gate electrode through the channel area, and different control voltages are applied to the second gate electrode according to the control period of the first gate electrode. The different control voltages are applied to the second gate electrode according to the turn on/off states of the switching element for increasing the turn on current in the channel area and for minimizing the turn off (leakage) current in the channel area.

30 Claims, 11 Drawing Sheets

DISPLAY APPARATUS

CROSS-REFERENCE TO RELATED APPLICATIONS

The present application claims priority from Korean Patent Application No. 2006-32296, filed on Apr. 10, 2006 in the Korean Intellectual Property Office, the disclosure of which is hereby incorporated herein by reference.

FIELD OF THE INVENTION

The present invention relates to a display apparatus including a driving element having enhanced electric characteristics.

DESCRIPTION OF THE RELATED ART

Generally, a flat panel display apparatus includes a liquid crystal display LCD panel, a gate driving circuit and a data driving circuit. The liquid crystal display panel includes an array substrate, a color filter substrate and a liquid crystal layer. The array substrate includes a plurality of gate lines, a plurality of data lines, a plurality of switching elements and a plurality of pixels electrically connected to each switching element. The color filter substrate is opposite to the array substrate. The liquid crystal layer is disposed between the array substrate and the color filter substrate. The gate driving circuit applies a gate signal to the gate lines. The data driving circuit applies a data signal to the data lines. In particular, the gate driving circuitry, which includes a plurality of switching elements, may be directly formed in a peripheral area of the array substrate to reduce the LCD apparatus size. Accordingly, the LCD apparatus has switching elements both in the pixel area and in the peripheral area. When the TFT switching elements have an amorphous silicon semiconductor layer, a signal delay or reduction may occur due to line resistance. The turn-on current of such a TFT is smaller than that of a TFT having a single or a multi crystal silicon semiconductor layer. Attempts to solve these problems have resorted to widening the channel width or reducing the channel length of the semiconductor layer. These design have limited utility because both the turn-on current and the leakage current when turned off increase.

SUMMARY OF THE INVENTION

The present invention provides a display device including a driving element having enhanced electrical characteristics increased turn-on current and minimized turn-off current. In an example display apparatus according to the present invention, the display apparatus includes a first gate electrode, a source electrode, a drain electrode, a channel area formed between the source and drain electrodes, and a second gate electrode electrically insulated from the first gate electrode through the channel area. Different control voltages are applied to the second gate electrode according to a control period of the first gate electrode.

In addition, the second gate electrode may include a transparent conductive material and the transparent conductive material may include ITO or IZO. Further, the channel area may include an amorphous silicon layer.

According to an example embodiment of the present invention, when a turn-on voltage is applied to the first gate electrode, a first control voltage having a reverse polarity to the turn-on voltage is applied to the second gate electrode. When a turn-off voltage is applied to the first gate electrode, the second gate electrode is electrically connected to a floating electrode.

According to another example embodiment of the present invention, when a turn-on voltage is applied to the first gate electrode, a first control voltage having a reverse polarity to the turn-on voltage is applied to the second gate electrode, and when a turn-off voltage is applied to the first gate electrode, a second control voltage having a ground voltage is applied to the second gate electrode.

According to still another example embodiment of the present invention, in a period of applying a turn-on voltage to the first gate electrode, a first control voltage having a same polarity to the turn-on voltage is applied to the second gate electrode, and in a period of applying a turn-off voltage to the first gate electrode, the second gate electrode may be electrically connected to a floating electrode.

According to still another example embodiment of the present invention, in a period of applying a turn-on voltage to the first gate electrode, a first control voltage having a same polarity to the turn-on voltage is applied to the second gate electrode, and in a period of applying a turn-off voltage to the first gate electrode, a second control voltage having a ground voltage may be applied to the second gate electrode.

In an example display apparatus according to the present invention, the display apparatus includes a pull-up circuit for outputting a first output voltage in a pull-up period, a pull-down circuit for outputting a second output voltage in a pull-down period, an output terminal electrically connected to the pull-up circuit and the pull-down circuit for carrying the first output voltage and the second output voltage to the display area, and a current control circuit for controlling a current of the pull-up circuit in the pull-up period and the pull-down period. The display apparatus may include a driving circuit having a movement period including the pull-up period and the pull-down period.

The pull-up circuit may include a source electrode electrically connected to a first voltage source, a drain electrode electrically connected to an output terminal, a channel area formed between the source electrode and drain electrode, a first gate electrode for controlling an electric current state of the channel by a pull-up signal, and a second gate electrode electrically insulated from the first gate electrode through the channel area and electrically connected to the current control circuit.

In addition, the second gate electrode may include a transparent conductive material, and in claim 12, the transparent conductive material may include ITO or IZO.

The channel area may include an amorphous silicon layer.

A current control circuit may apply a first control voltage to the second gate electrode in the pull-up period, and a second control voltage different from the first control voltage to the second gate electrode in the pull-down period.

In addition, the current control circuit may include a first control voltage source, a second control voltage source, and a control voltage source selective circuit for selecting an electrical connection between the second gate electrode and one of the first and second control voltage sources according to the movement period.

Furthermore, the control voltage source selective circuit is turned on by the pull-up signal, is turned on by a first switching element electrically connecting the first voltage source and the second gate electrode and the pull-down signal in turn-on state, and may include a second switching element electrically connecting the second control voltage source and the second gate electrode in turn-on state.

Also, the first switching element may include a source electrode electrically connected to the first control voltage source, a drain electrode electrically connected to the second gate electrode, and a first thin film transistor including a gate electrode to which the pull-up signal is applied. The second switching element may include a source electrode electrically connected to the second control voltage source, a drain electrode electrically connected to the second gate electrode and a second thin film transistor including a gate electrode to which the pull-down signal is applied.

The first control voltage source may supply a voltage having a reverse polarity to a turn-on voltage of the pull-up signal, or may supply a voltage having a same polarity to the turn-on voltage of the pull-up signal.

In addition, the pull-down circuit may include a thin film transistor having a source electrode electrically connected to a second output voltage source, a drain electrode electrically connected to the output terminal, a channel area formed between the source and drain electrode, a gate electrode controlling an electric current state of the channel by a pull-down signal.

In the above example embodiment, the pull-down signal may have a reverse phase to the pull-up signal.

In addition, the second control voltage source may supply a ground voltage, or may be a floating electrode.

Furthermore, the first output voltage source may generate a clock having a shorter period than the pull-up period, and in this occasion, the clock may output a high signal in the pull-up period. In this example embodiment, a first output voltage may be a high signal in the clock, and may be connected to a gate line formed on the display area.

BRIEF DESCRIPTION OF THE DRAWING

The above and other features and advantages of the present invention will become more apparent from the ensuing description when read together with the accompanying drawings, in which.

DESCRIPTION OF THE EMBODIMENTS

Figure 1:
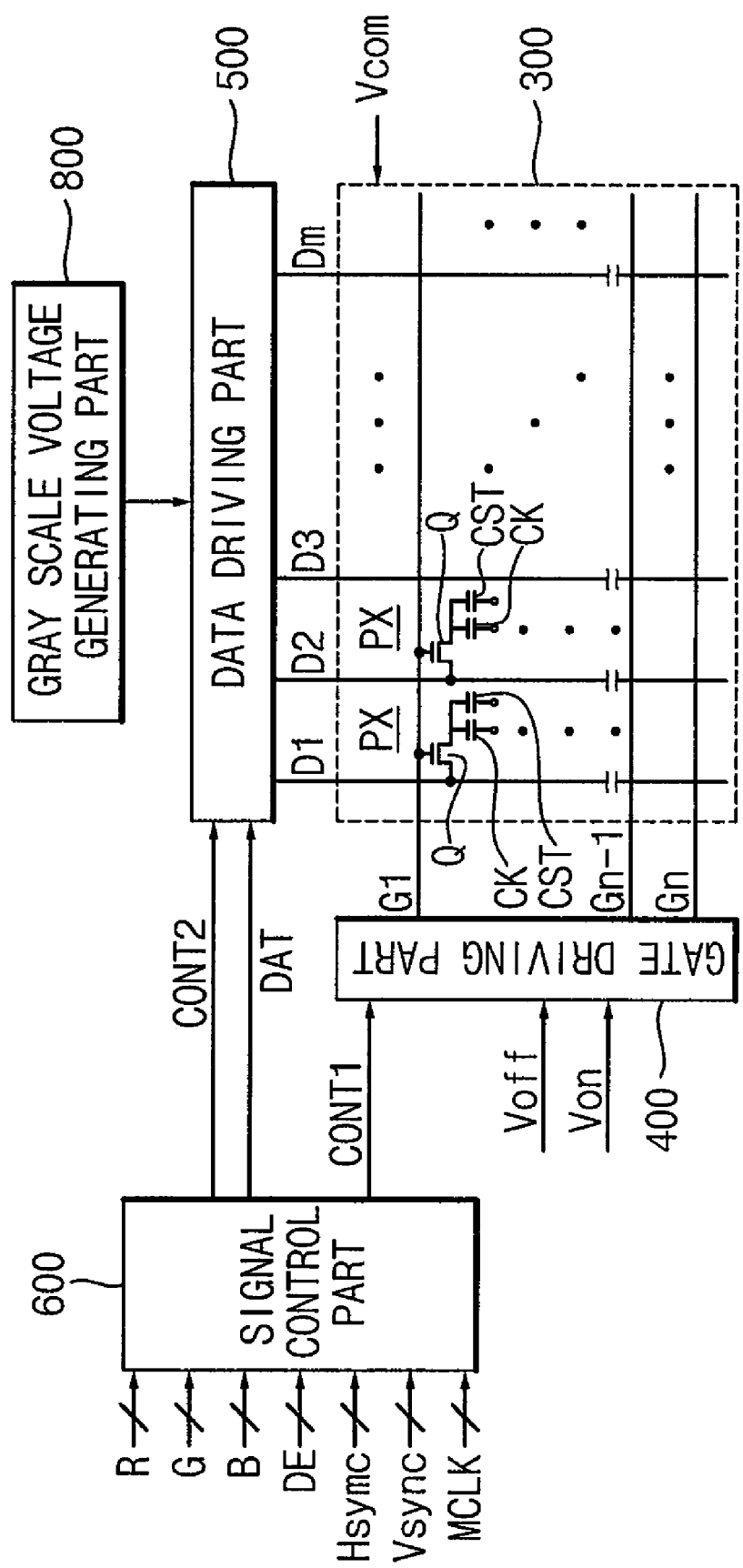
FIG. 1 is a block diagram illustrating a liquid crystal display apparatus according to an example embodiment of the present invention.

Hereinafter, the present invention will be explained in detail with reference to the accompanying drawings. FIG. 1 is a block diagram illustrating a liquid crystal display apparatus according to an example embodiment of the present invention.

Referring to FIG. 1, according to the example embodiment, a display apparatus includes an LCD display panel 300, a driving element having a gate driving element 400 and a data driving element 500, a gray scale voltage generating part 800 electrically connected to the data driving element 500, and a signal control part 600 for controlling the gate driving element 400 and the data driving element 500. The LCD panel 300 includes a pixel area having a plurality of pixels for displaying an image, and a non-display area excluding the pixel area.

The LCD panel 300 includes a plurality of signal lines, and a plurality of pixels PX is electrically connected to the signal lines and is arranged in a matrix shape. In addition, the LCD panel 300 may include a lower substrate and an upper substrate facing each other, and a liquid crystal layer disposed between the lower and upper substrates.

A switching element Q is an element having three terminals such as a TFT disposed in the lower substrate. A control terminal of the switching element is electrically connected to a gate line GL, an input terminal of the switching element is electrically connected to a data line DL, and an output terminal of the switching element is electrically connected to a liquid crystal condenser C1c and a constant condenser Cst. Referring to FIG. 1, the switching elements Q are sequentially connected to different data lines D1~Dm in adjacent pixels PX of the same row.

The gray scale voltage generating part 800 generates a pair of gray scale voltage groups (or reference gray scale voltage group) related to a transmissivity of the pixel PX. A first group has a positive voltage with respect to a common voltage Vcom, and a second group has a negative voltage.

Gate driving element 400 is electrically connected to gate lines G1~Gn of the LCD panel 300, and applies a gate signal to the gate lines G1~Gn. The gate signal corresponds to a combination of gate on voltage Von and a gate off voltage Voff.

Data driving element 500 is electrically connected to data lines D1~Dm for selecting a gray scale voltage from the gray scale voltage generating part 800 and for applying the selected gray scale voltage to the data lines D1~Dm as a data signal. However, when the gray scale voltage generating part 800 does not supply all voltages corresponding to the entire gray scale but only supplies some reference gray scale voltages, the data driving element 500 divides the reference gray scale voltages into the entire gray scale voltages and selects the data signal among the entire gray scale voltages.

Signal control part 600 controls the driving element such as the gate driving element 400, the data driving element 500 and so on.

Each driving element 400, 500, 600 and 800 may be directly mounted on a non-display area of the LCD panel 300 as at least one of integrated circuit chip (COG). Alternatively, each driving element 400, 500, 600 and 800 may be mounted on a flexible printed circuit film (not shown) attached on the LCD panel 300 as a tape carrier package (TCP). Alternatively, each driving element 400, 500, 600 and 800 may be mounted on another printed circuit board (not shown). Alternatively, these driving elements 400, 500, 600 and 800 together with signal lines G1~Gn, D1~Dm, the switching element Q of the TFT and so on, may be integrated into the LCD panel assembly 300. In addition, the driving elements 400, 500, 600 and 800 may be integrated into a single chip.

Figure 2:
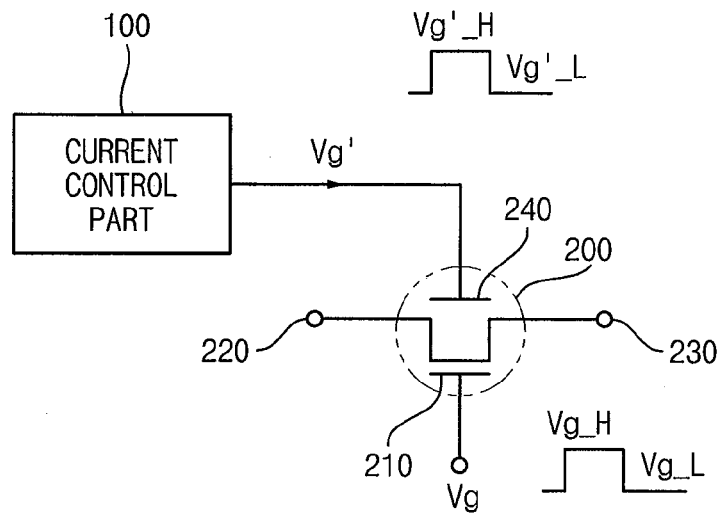
FIG. 2 is a block diagram illustrating a switching element and a current control part according to the present invention.

FIG. 2 is a block diagram illustrating a switching element and a current control part according to the present invention.

A TFT 200 includes a source electrode 220, a drain electrode 230, a channel area (not shown) formed between the source and drain electrodes, a first gate electrode 210, and a second gate electrode 240. The first gate electrode 210 controls an electric current of the channel area according to a gate voltage applied to a first control voltage Vg. The second gate electrode 240 is insulated from a first gate electrode. A second control voltage Vg is applied to the second gate electrode 240. The first control Vg has a high level Vg_H corresponding to a turn-on voltage of the TFT 200 and a low level Vg_L corresponding to a turn-off voltage thereof. The second control voltage Vg is applied to the second gate electrode 240 and controls the channel current of the TFT 200.

Figure 3:
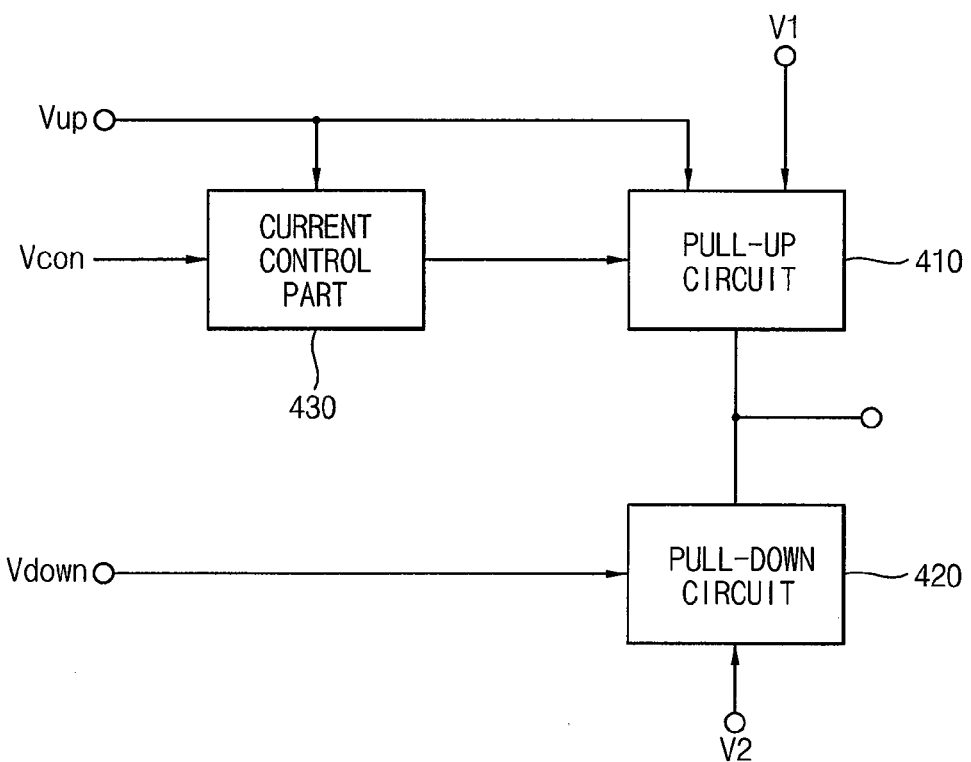
FIG. 3 is a block diagram illustrating a driving part having one current control voltage source according to the present invention.

FIG. 3 is a block diagram illustrating a driving part having a current control voltage source according to the present invention. A gate driving element includes a pull-up circuit 410, a current control part and a pull-down circuit 420. Pull-up circuit 410 operates as a first switching signal when a pull-up signal is applied to pull-up circuit 410. The current control part operates when a pull-up signal is applied to the current control part, so that the current control part applies a current control voltage to the pull-up circuit. Pull-down circuit 420 operates when a pull-down signal is applied to pull-down circuit 420. The pull-down signal is a second switching signal having a phase different from that of the pull-up signal, Each pull-up circuit 410 and pull-down circuit 420 are respectively connected to each two input terminals V1, Vup, V2, Vdown and a common output terminal Vout outputting a driving control voltage.

Pull-up circuit 410 is electrically connected to a pull-up signal input terminal Vup, and pull-down circuit 420 is electrically connected to a pull-down signal input terminal Vdown. The pull-up signal that is applied from the pull-up signal input terminal Vup controls the switching action of pull-up circuit 410. The pull-down signal that is applied from the pull-down signal input terminal Vdown controls the switching action of pull-down circuit 420. Each input terminal V1 and V2 of pull-up circuit 410 and pull-down circuit 420 is electrically connected to a first signal source and a second signal source different from each other.

Pull-up circuit 410 outputs the signal from first input terminal V1 to output terminal Vout during a turned-on period determined by pull-up signal Vup. Then, pull-up circuit 410 controls the channel circuit by the signal from the current control part driven by the pull-up signal. The driving voltage on output terminal Vout drives a gate of the display panel. Pull-down circuit 420 applies a signal from the second signal source appearing on input terminal V2 to output terminal Vout during the turned-on period of the pull-down signal Vdown. According to the example embodiment, a voltage source generating the clock signal may be used as the first signal source, and a DC voltage source may be used as the second signal source.

According to the example embodiment, the pull-up signal and the pull-down signal have a phase difference such as 180°. In the example embodiment, when one of the pull-up and pull-down signals is in a turn-on level, the other is in a turn-off level. When pull-up circuit 410 is turned on by the pull-up signal, circuit 410 outputs the first signal source voltage to output terminal Vout. At this time, pull-down circuit 420 is turned off by the pull-down signal and does not operate. When pull-down circuit 420 is turned on by the pull-down signal, circuit 420 outputs the second signal source to output terminal Vout. At this time pull-up circuit 410 is not operated by the pull-up signal. For example, when pull-up circuit 410 outputs the voltage of the first signal source to the output terminal Vout, pull-down circuit 420 does not operate and thus has no effect on the output of the output terminal Vout. On the contrary, when pull-down circuit 420 outputs the voltage of the second signal source to the output terminal Vout, pull-up circuit 410 does not operate and thus has no effect on the output of the output terminal Vout.

Current control part 430 is connected to current control terminal Vcon1, pull-up signal input terminal Vup and pull-up circuit 410. A current control signal is applied to the current control terminal Vcon1. Current control part 430 is turned on by pull-up signal Vup and applies the current control signal from current control terminal Vcon1 to pull-up circuit 410 to control the flowing to output terminal Vout.

Figure 4:
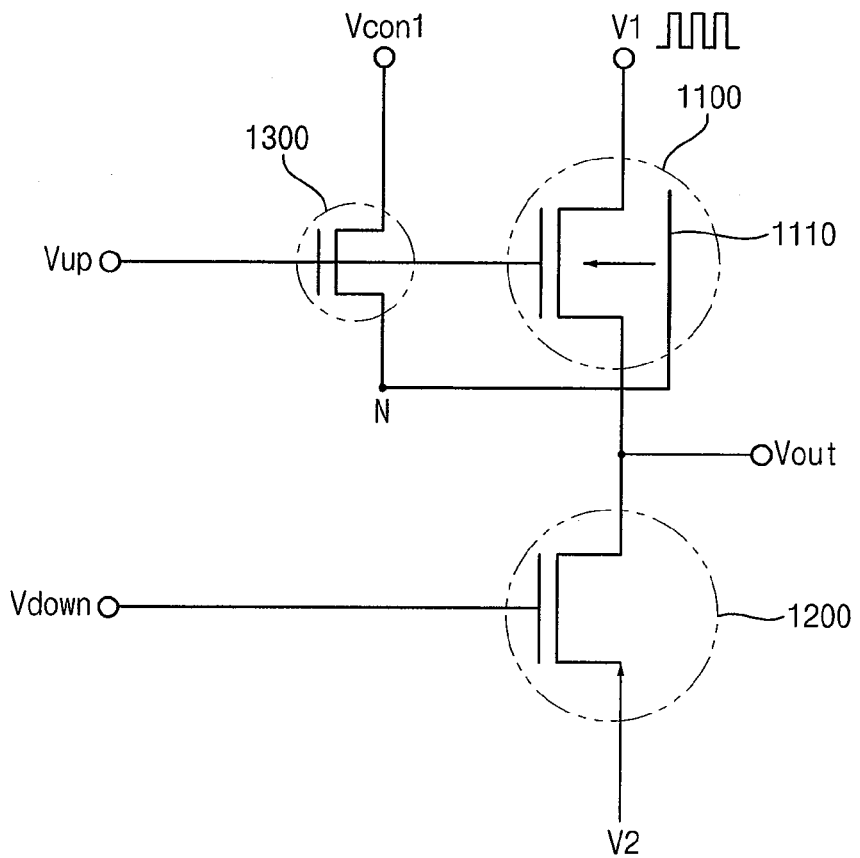
FIG. 4 is a circuit diagram illustrating a driving part according to a first example embodiment.

According to the example embodiment, the gate driving element of the display apparatus may include a TFT. Referring to FIG. 4, elements of the gate driving element according to the example embodiment including a plurality of TFTs, will be explained in detail as follows.

A pull-up circuit includes a TFT 1100 having a source electrode, a drain electrode, a channel area, a first gate electrode and a second gate electrode 1110. The source electrode is electrically connected to a first input terminal V1. The drain electrode is electrically connected to an output terminal Vout. The channel area is formed between the source electrode and the drain electrode. The first gate electrode is electrically connected to a pull-up signal input terminal Vup to which a first control voltage is applied as a pull-up signal, for controlling an electric current state of a channel area. The second gate electrode 1110 is electrically insulated from the first gate electrode through the channel area and different second control voltages are applied to the second gate electrode 1110 according to an operating period of the first control voltage. The channel area of the pull-up TFT 1100 includes a semiconductor layer, and may preferably include the same semiconductor layer as the switching element Q of the pixel area. In this case, when the switching element Q of the pixel area is a multi-crystal semiconductor layer, the pull-up TFT 1100 also includes a channel area having the multi-crystal semiconductor layer.

When the switching element Q of the pixel area includes an amorphous silicon semiconductor layer, the pull-up TFT 1100 also includes a channel area having the multi-crystal semiconductor layer. However, the forming process of the semiconductor layer in the channel area of the pull-up TFT 1100 may be different from that of the switching element Q in the pixel area, and thus, crystalline states of the semiconductor layer between the channel area and the switching element Q may be different from each other.

The second gate electrode 1110 may include a conductive material. Examples of a material that can be used for the second gate electrode 1110 may include a metal, a metallic oxide and so on. The second gate electrode 1110 may preferably include a transparent conductive material. Examples of the material that can be used for the second gate electrode 1110 may include indium tin oxide (ITO), indium zinc oxide (IZO), and so on.

A pull-down circuit includes more than one of TFT 1200 having a source electrode, a drain electrode, a gate electrode and a channel area. The source electrode is electrically connected to a second input terminal V2. The drain electrode is electrically connected to the output terminal Vout as the drain electrode of the pull-up circuit. The gate electrode is electrically connected to a pull-down signal input terminal Vdown. A third control signal is applied to the pull-down signal input terminal Vdown. The third control signal is a pull-down signal having a different phase from the first control voltage applied to the first gate electrode. The channel area is formed between the source electrode and the drain electrode. The channel area of a pull-down TFT 1200 includes a semiconductor layer, and the forming process and a crystalline state of the semiconductor layer in the pull-down TFT 1200 is the same as explained above for pull-up TFT 1100.

A current control part includes at least one switching element. The switching element may include a TFT. According to the example embodiment, a control switching element includes a TFT having a gate electrode, a source electrode and a channel area. The gate electrode is electrically connected to the pull-up signal input terminal Vup to which the first control voltage is applied, for operating with the same operating period as the first gate electrode. The source electrode is electrically connected to a current control terminal Vcon1, and a current control signal is applied to the source electrode. The channel area is formed between the drain electrode and the source electrode. The drain electrode of the current control TFT 1300 is electrically connected to the second gate electrode 1110 of the pull-up TFT 1100. Since the pull-up signal Vup is applied to the gate electrode of the current control TFT 1300, an operating period of the TFT 1300 is the same as that of the pull-up TFT 1100.

The gate driving element has been explained in the above example embodiment, but according to the driving element of the present invention, the driving element may include not only the gate driving element but also a data driving element, a pixel driving element of a display panel, and so on.

For example, when the switching element Q of the pixel area includes the second gate electrode, the example embodiment may be used to control the voltage of the second gate electrode.

Figure 5:
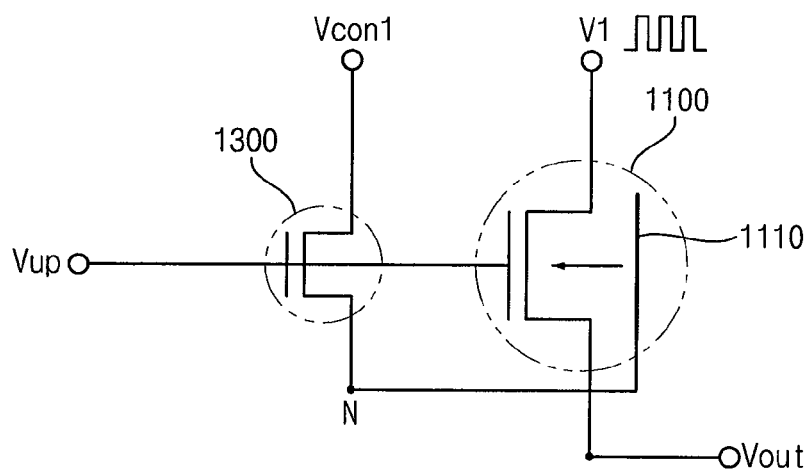
FIG. 5 is a circuit diagram illustrating a pixel switching element and a current control circuit according to the first example embodiment.

Referring to FIG. 5, the TFT 1100 corresponds to the switching element Q of the pixel area, the first signal corresponds to the data voltage that is applied through the data line. The drain electrode of the TFT 1100 is electrically connected to the pixel electrode. The gate signal that is applied through the gate line is used as the first switching signal, and the current control signal Vcon1 is periodically applied to the TFT 1100 by the switching element 1300 for controlling the current. In this case, the current control part 430 is formed in a peripheral area of the display.

Figure 6:
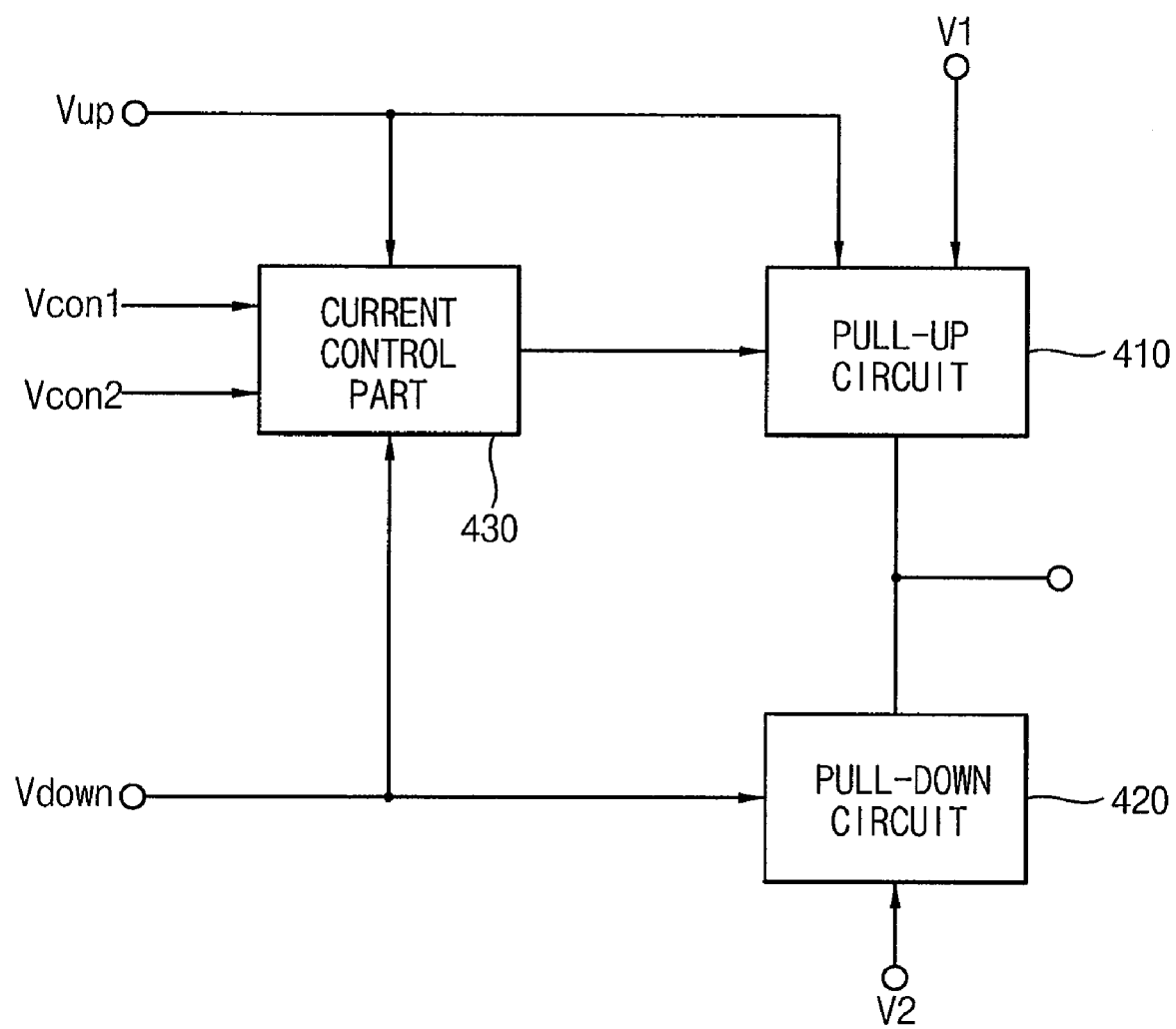
FIG. 6 is a block diagram illustrating a driving part having two current control voltage sources according to the present invention.

FIG. 6 is a block diagram illustrating a driving part having two current control voltage sources according to the present invention.

Referring to FIG. 6, a block diagram of a gate driving element is explained as follows according to another example embodiment.

A pull-up circuit 410 and a pull-down circuit 420 are the same as the example embodiment. A current control part 430 is electrically connected to a current control terminal Vcon1 and Vcon2 to which a current control signal is applied. A pull-up signal is applied at input terminal Vup, a pull-down signal is applied at input terminal Vdown. Current control part 430 is connected to pull-up circuit 410. When current control part 430 is turned on by the pull-up signal Vup or by the pull-down signal Vdown, respectively, it applies the first and second current control signals from the first and second current control terminal Vcon1 and Vcon2 to pull-up circuit 410. In this manner, current control part 430 controls the output current that pull-up circuit 410 applies to output terminal Vout.

Figure 7:
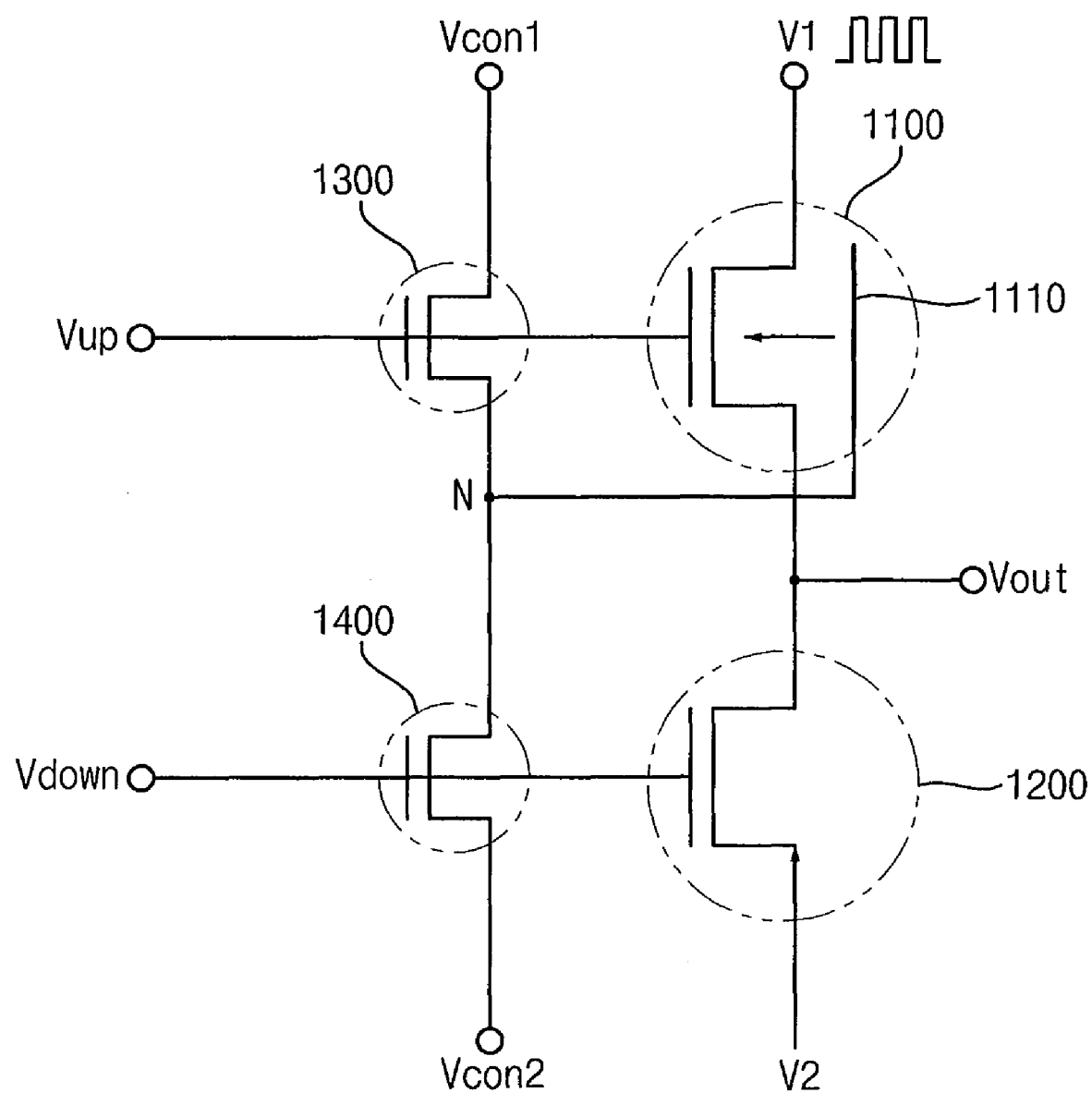
FIG. 7 is a circuit diagram illustrating a driving part according to a second example embodiment.

FIG. 7 is a circuit diagram illustrating a driving part according to a second example embodiment of the present invention.

Referring to FIG. 7, a gate driving element including a TFT will be explained as follows according to the example embodiment. The formation of this pull-up circuit and pull-down circuit is the same as the example embodiment illustrated in FIG. 4. A current control part preferably includes two or more control switching elements, and the switching element may include a TFT. A first current control TFT includes a TFT 1300 having a gate electrode, a source electrode, a drain electrode and a channel area. The gate electrode is electrically connected to a pull-up signal input terminal Vup to which a first control voltage is applied, for operating with the same operating period as a first gate electrode. The source electrode is electrically connected to a first current control terminal Vcon1 to which a first current control signal is applied. The drain electrode is electrically connected to a second gate electrode of the pull-up TFT, for outputting a first current control signal. The channel area is formed between the source electrode and the drain electrode.

A second current control TFT may include a TFT 1400 having a gate electrode, a source electrode, a drain electrode and a channel area. The gate electrode is electrically connected to a pull-down signal input terminal Vdown to which a pull-down signal is applied as a second switching signal, for operating with the same operating period as a gate electrode of the pull-down TFT. The source electrode is electrically connected to a second current control terminal Vcon2, and a second current control signal is applied to the second current control terminal Vcon2. The drain electrode is electrically connected to a second gate electrode of the pull-up TFT, for outputting a second current control signal. The channel area is formed between the source electrode and the drain electrode.

When a channel of the TFT in the current control part is turned on, the first current control signal is applied to the second gate electrode via the first current control terminal Vcon1 to increase the channel current. When a channel of the TFT in the current control part is turned off, the second current control signal is applied to the second gate electrode via the second current control terminal Vcon2 to minimize the channel current (a leakage current).

The principle and experimental results about controlling the channel current according to the second gate electrode will be explained as follows. The drain electrode of the first current control TFT 1300 and second current control TFT 1400 is a common node N and is electrically connected to the second gate electrode of the pull-up TFT 1100. The pull-up signal is applied to the gate electrode of the first current control TFT 1300, and the pull-down signal is applied to the gate electrode of the second current control TFT 1400. Therefore, the operating period of the first current control TFT 1300 is the same as that of the pull-up TFT 1100 and the operating period of the second current control TFT 1400 is the same as that of the pull-down TFT 1200.

According to the example embodiment, a voltage source generating a clock signal may be used as a first signal source, and a DC voltage source may be used as a second signal source. In addition the second signal source may be electrically connected to the second current control terminal Vcon2 and may be used as the second current control signal.

An exemplary gate driving element has been explained in the example embodiment. However, the driving element of the present invention is not limited to a gate driving element and may be used for a data driving element, a pixel driving element of a display panel, and so on.

Figure 9:
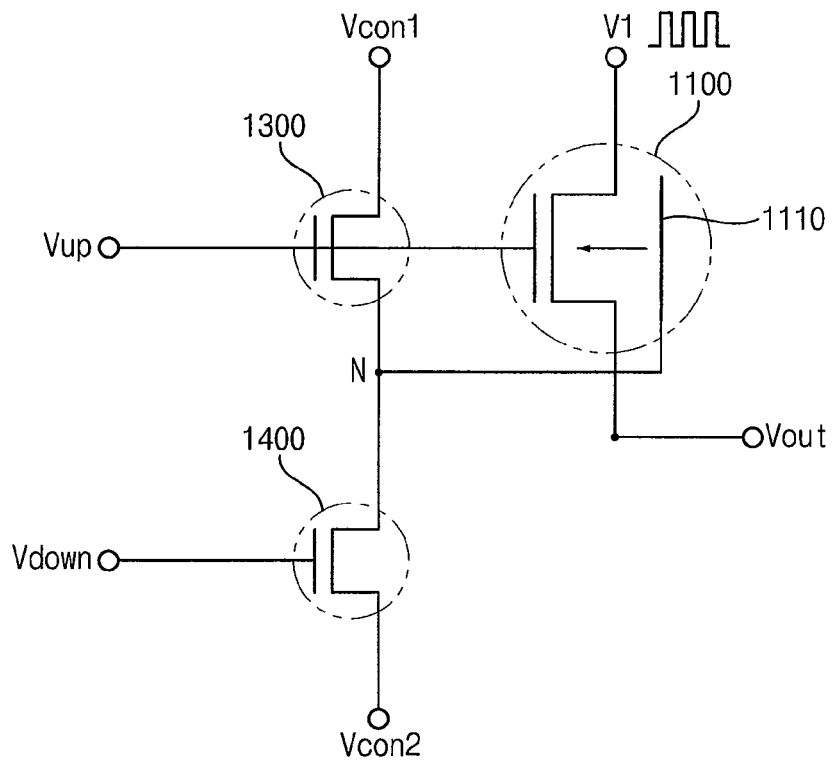
FIG. 9 is a circuit diagram illustrating a pixel switching element and a current control circuit according to the second example embodiment.

For example, when the switching element Q of the pixel area includes the second gate electrode, the example embodiment may be used to control a voltage of the second gate electrode. Referring to FIG. 9, the TFT 1100 corresponds to the switching element Q of the pixel area, the first signal corresponds to the data voltage that is applied through the data line, and the drain electrode of the TFT 110 is electrically connected to the pixel electrode. The gate signal that is applied through the gate line is used as the first switching signal. The signal that has a reverse phase to the gate signal is used as the second switching signal. In this case, the current control part 430 is formed in a peripheral area.

Figure 8:
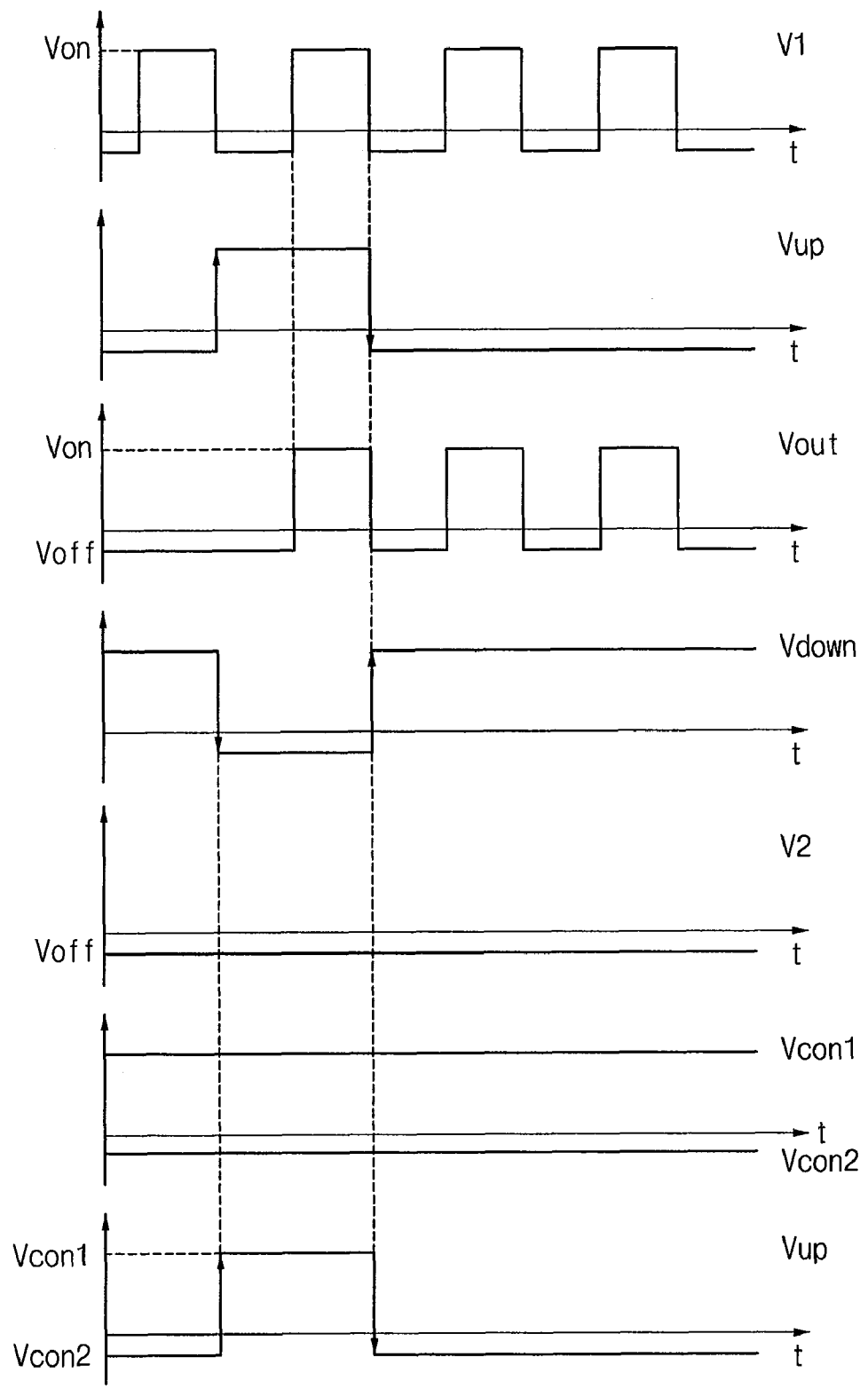
FIG. 8 is a timing diagram illustrating an input and output signal of a driving element in FIG. 5.

According to the example embodiment, the operation of a driving element having four TFTs with an N-type semiconductor layer will be explained in detail referring to FIGS. 6 to 8.

All the TFTs 1100, 1200, 1300 and 1400, according to the example embodiment, may be formed with the N-type semiconductor layer, and thus are turned on by a positive voltage. A pull-up signal Vup has reverse phase to pull-down signal Vdown. For example, when the pull-up signal Vup is at a turn-off level, the pull-down signal Vdown is at a turn-on level (hereinafter, referred to as pull-down period), and when the pull-up signal Vup is in turn-on level, the pull-down signal Vdown is in turn-off level (hereinafter, referred to as pull-up period).

When the first TFT 1300 and pull-up TFT 1100 are turned on by the pull-up signal in the pull-up period, a clock signal is applied to the drain electrode, and the clock signal is outputted through the output terminal Vout. In this case, the clock signal is the first signal source that is applied to the source electrode of the pull-up TFT 1100 through the first input terminal V1. Since the pull-down TFT 1200 maintains turn-off state in the pull-up period, a voltage signal is not outputted through the output terminal Vout. In this case, the voltage signal is the second signal source that is applied to the second input terminal V2. Since the first TFT 1300 is in turn-on state in the pull-up period, the first control voltage that is applied to the first current control terminal Vcon1, is applied to the second gate electrode 1110 of the pull-up TFT 1100 via the source and drain electrodes of the first TFT 1300, so that the first control voltage increases currents of the source and drain electrodes of the pull-up TFT 1100.

Alternatively, according to the example embodiment, since the second TFT 1400 is in a turn-off state in the pull-up period, the second control voltage that is applied through the second current control terminal Vcon2, is not applied to the second gate electrode 1110 of the pull-up TFT 1100.

When the first TFT 1300 and pull-up TFT 1100 are turned off by the pull-up signal in the pull-down period, the first signal source that is applied to the source electrode of the pull-up TFT 1100 through the first input terminal V1, is not applied to the drain electrode, so that the first signal source is not outputted through the output terminal Vout. Since the pull-down TFT 1200 maintains a turn-on state in the pull-up period, a voltage signal of the second signal source that is applied to the second input terminal V2, is outputted through the output terminal Vout via the source and drain electrodes of the pull-down TFT 1200. Since the first TFT 1300 is in a turn-off state in the pull-down period, the first control voltage that is applied to the first current control terminal Vcon1, is not applied to the second gate electrode 1110 of the pull-up TFT 110, so that the first control voltage does not increase the currents of the source and drain electrodes of the pull-up TFT 1100.

Alternatively, according to the example embodiment, since the second TFT 1400 is in a turn-on state in the pull-up period, the second control voltage that is applied through the second current control terminal Vcon2, is applied to the second gate electrode 1110 of the pull-up TFT 1100. However, when a positive (+) voltage not exceeding a threshold voltage Vth or a negative (−) voltage is applied to the second gate electrode 1110, the pull-up TFT 1100 is not to be conductive, so that the first signal voltage applied through the first input terminal has no effect on the output.

In the example embodiment, the current control part including the switching element such as TFT has been explained, but the current control part may include a power source generating a pulse signal. For example, in the current control part in FIG. 2, when a power source that generates a pulse signal having a wave shape of a last timing diagram in FIG. 8, is electrically connected to the second gate electrode, the same current control as the example embodiment can be possible.

In addition, a period of the current control signal is the same as that of the first switching signal in the example embodiment, but the period of the first switching signal may be different from that of the current control signal.

Figure 10:
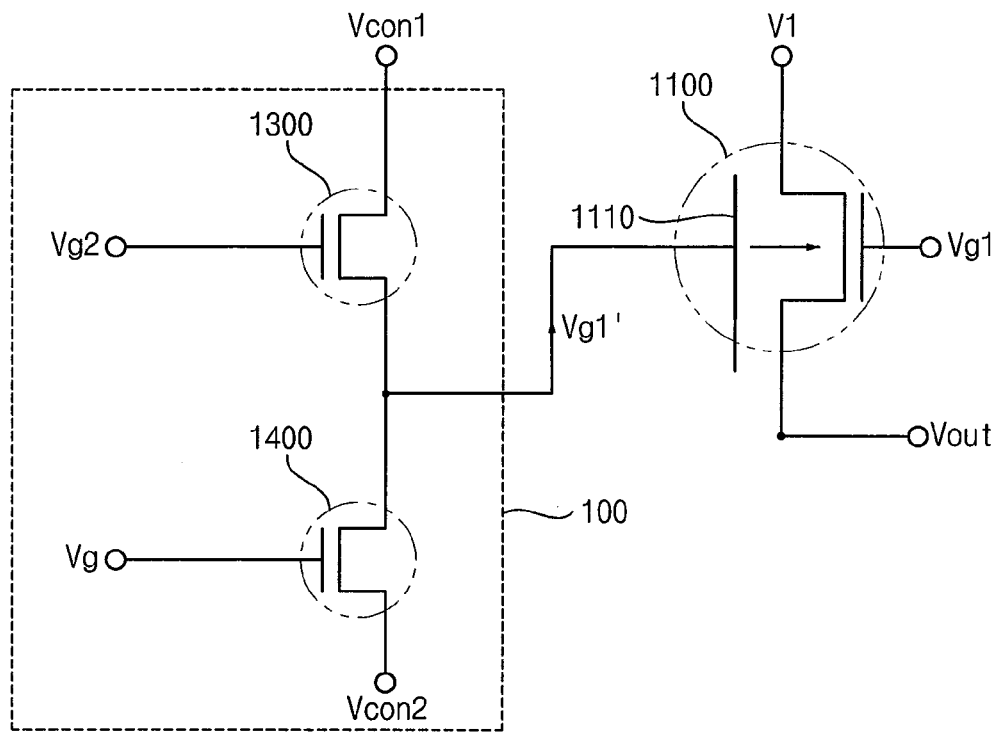
FIG. 10 is a circuit diagram embodying the block diagram in FIG. 2 according to the present invention.
Figure 11:
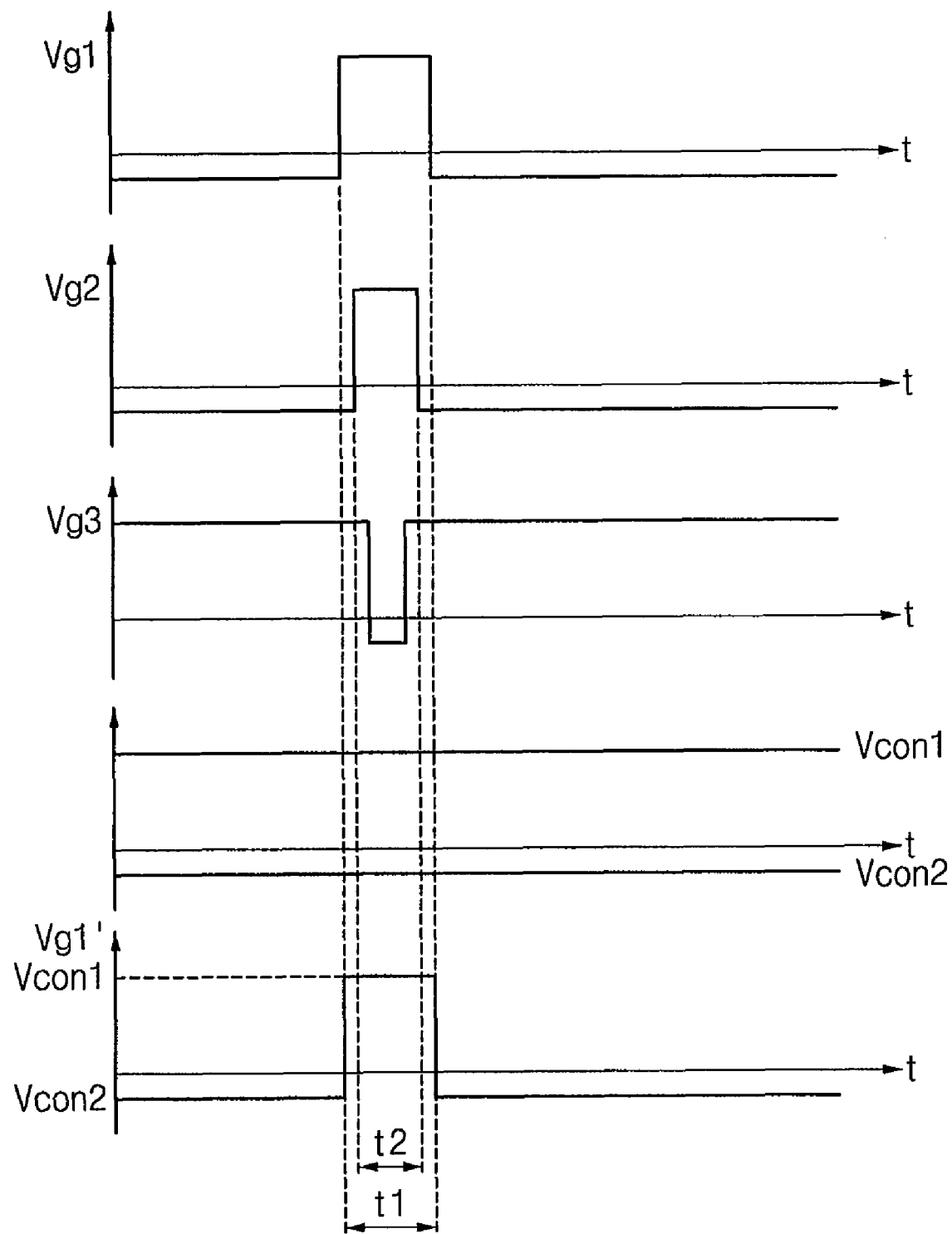
FIG. 11 is a timing diagram illustrating an input and output signal of a driving element in FIG. 10.

FIG. 10 is a circuit diagram embodying the block diagram in FIG. 2 according to the present invention, and FIG. 11 is a timing diagram illustrating input and output signals of a driving element in FIG. 10.

Referring to FIGS. 10 and 11, when a signal Vg2 having a shorter turn-on period t2 than a turn-on period t1 of a first switching signal Vg1 is applied to the gate electrode of the first current control TFT 1300, and a signal Vg3 having a reverse phase to the signal Vg2 is applied to the gate electrode of the second current control TFT 1400, the time that is necessary for the first current control signal to be applied becomes shorter than in the example embodiment in FIG. 6. In this case, the signals Vg2 and Vg3 may be generated apart from the first control signal to be applied to the gate electrode of the current control TFT 1300 and 1400, or may be generated through a special element modifying the first switching signal.

In addition, in the example embodiment, it has been explained that the channel current is controlled by forming the second gate electrode in the pull-up TFT, but the channel current may be controlled by forming the second gate electrode in the pull-down TFT.

For example, the example embodiment illustrated in FIGS. 6 and 7, the second gate electrode electrically connected to the common mode, may be formed in the pull-down TFT.

According to a driving circuit of the present invention, the driving circuit may be formed in a peripheral area of the display apparatus. A structure of the driving circuit will be explained referring to FIGS. 12 and 13.

Figure 12:
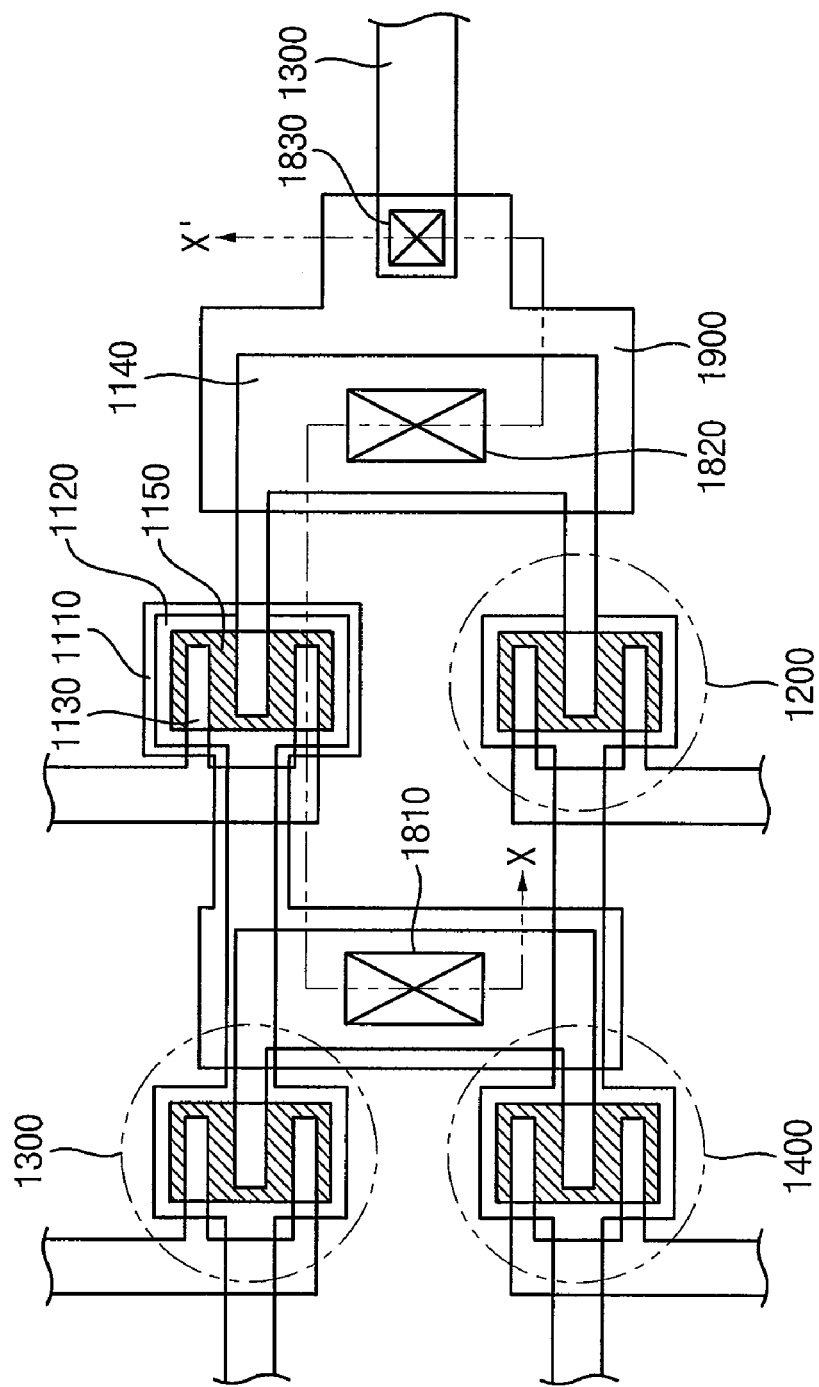
FIG. 12 is a plan view illustrating a layout of the driving part in FIG. 6.
Figure 13:
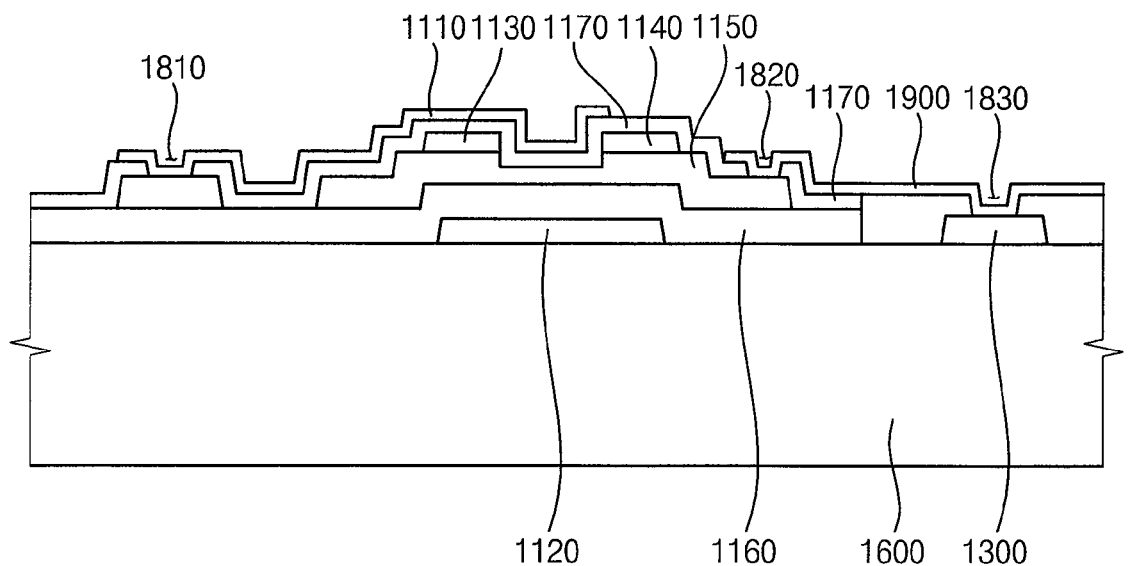
FIG. 13 is a cross-sectional view taken along a line X-X' of a driving circuit in FIG. 12.

FIG. 12 is a plan view illustrating a layout of the driving part in FIG. 6, and FIG. 13 is a cross-sectional view taken along a line X-X' of a driving circuit 15 in FIG. 12.

Firstly, a structure of the pull-up TFT is as followed. A gate electrode 1120 and a gate signal line are formed on a transparent substrate 1600 such as glass and so on. A semiconductor layer 1150 is formed between the gate electrode 1120 and source and drain electrodes 1130 and 1140. A gate insulation layer 1160 is formed between the gate electrode 1120 and the semiconductor layer 1150. The second gate electrode 1110 of the pull-up TFT is electrically insulated from the source and drain electrode 1130 and 1150 through a protective layer 1170 such as silicon nitride and so on. The second gate electrode 1110 of the pull-up TFT is electrically connected to a drain electrode of a first control TFT and a second control TFT through a first contact hole 1810 of the protective layer 1170.

According to an output terminal of the present invention, since the output terminal 1500 of a gate driving element is formed with the same layer as the gate electrode 1120, a drain electrode and a gate line of the pull-up and pull-down TFTs are electrically connected to each other through a line layer 1900 such as ITO or IZO. The line layer 1900 is formed on a second contact hole 1820 that is electrically connected to the drain electrode and exposes a common terminal 1140, and a third contact hole 1830 that exposes the output terminal 1500.

According to an example embodiment of the present invention, a driving principle of the pull-up TFT will be explained referring to FIGS. 14A to 14C.

Figure 14A:
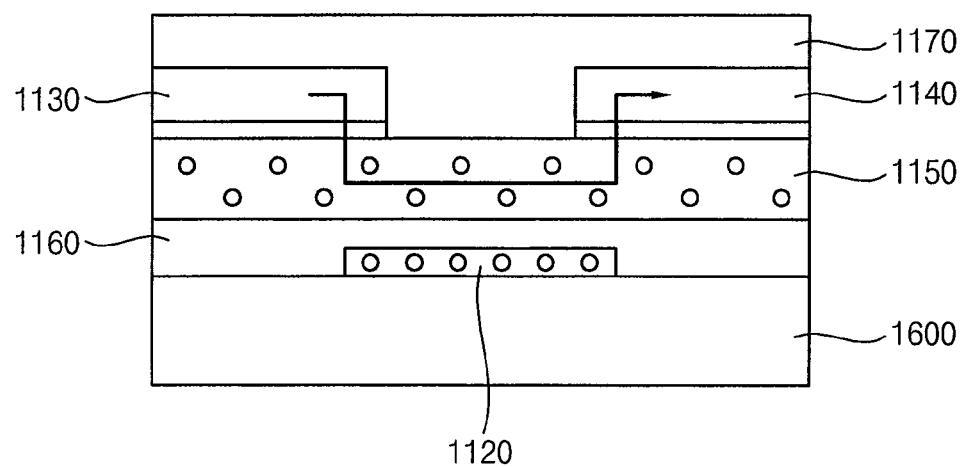
FIGS. 14A to 14C are front views roughly illustrating a driving principle of a pull-up circuit according to an example embodiment of the present invention.
Figure 14B:
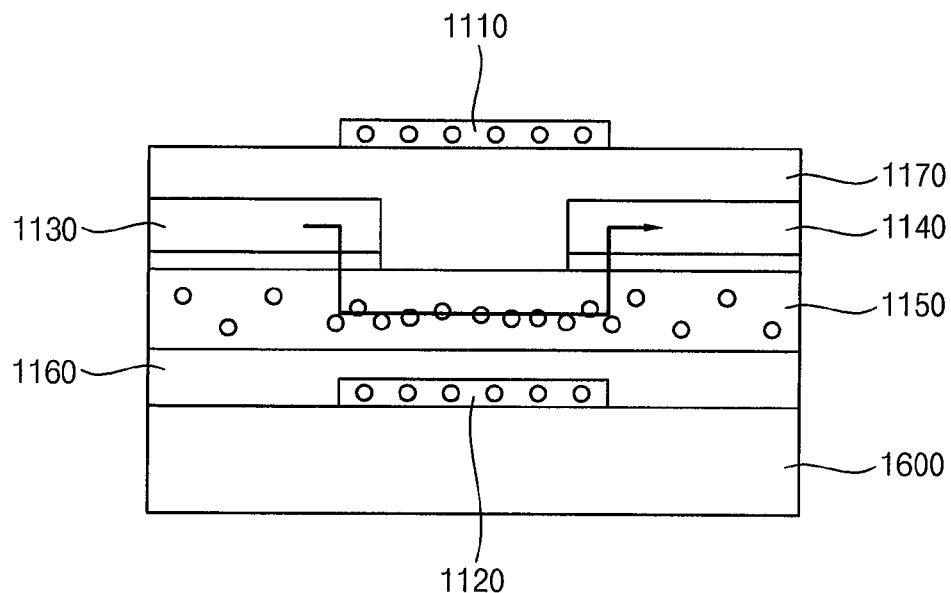
Figure 14C:
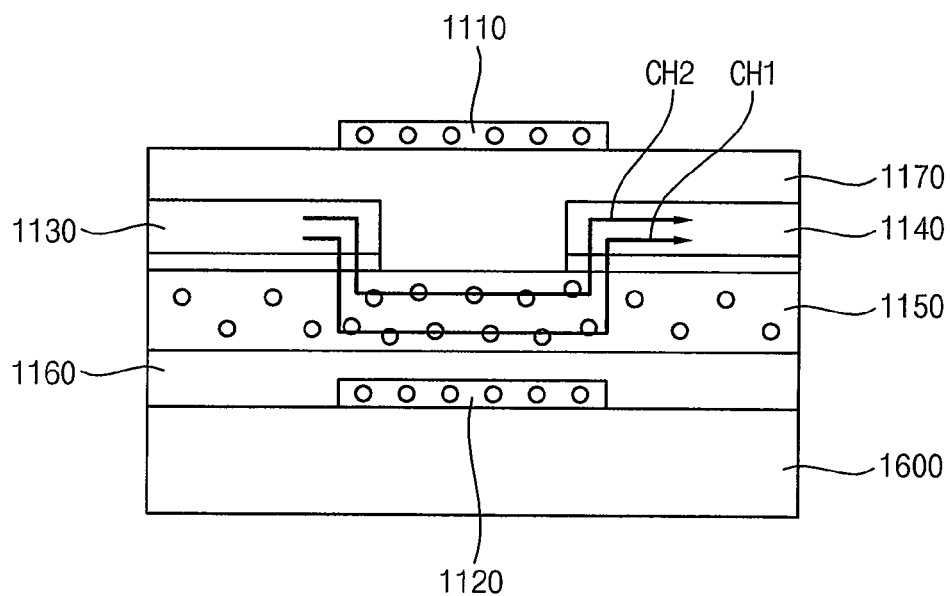

FIGS. 14A to 14C are front views roughly illustrating a driving principle of a pull-up circuit according to the example embodiment.

As illustrated in FIG. 14A, when the pull-up TFT has an N-type semiconductor layer and a positive voltage over a threshold voltage is applied to the gate electrode, electrons that correspond to a number of carriers, are driven into the gate electrode, so that a channel is formed to be charged with electric current. When, as illustrated in FIG. 14B, the semiconductor layer is sandwiched between two gate electrodes insulated from each other, the positive voltage is applied to the first gate electrode and a negative voltage is applied to the second gate electrode simultaneously, the electrons are driven to the first gate electrode, and thus more electrons can pass through the channel. Alternatively, as illustrated in FIG. 14C, when the positive voltage is applied to the second gate electrode, the electrons are driven to a semiconductor layer of the second gate direction, and thus a second channel is formed to be charged with electric current.

Therefore, when an arbitrary voltage (regardless of a polarity) is applied to the second gate electrode with the turn-on voltage applied to the first gate electrode, an effect on increasing a channel current can be achieved. According to the above mechanism, although the turn-off voltage is applied to the first gate electrode, the semiconductor layer is charged with electric current when the arbitrary voltage is applied to the second gate electrode.

Having described the N channel TFT, but a P channel TFT has the same operating principle except that the turn-on and turn-off voltages applied to the first gate electrode are reversed.

To minimize the current of the semiconductor layer in the turn-off state, the second gate electrode needs to be grounded or floated. Therefore, when the pull-up TFT is in the turn-off state, the leakage current of the semiconductor layer can be minimized by connecting the second gate electrode to the floating electrode or the ground power source. The floating electrode is preferably designed to have enough space for electric charges induced to the second gate electrode to be re-distributed.

According to the present invention explained above, a different control voltage is applied to the second gate electrode according to the turn-on or turn-off state of the switching element, so that the turn-on current of the channel area can increase and the turn-off current thereof can be minimized. Therefore, the display apparatus can be operated more efficiently. Having described the example embodiments of the present invention and its advantage, it is noted that various changes, substitutions and alterations can be made herein without departing from the spirit and scope of the invention.

What is claimed is:

1. A display apparatus comprising:
a thin film transistor (TFT) including a source electrode receiving a first signal, a drain electrode electrically connected to a driving voltage output terminal, a first gate electrode receiving a first switching voltage with a constant period, a channel area formed between the source electrode and the drain electrode, and a second gate electrode electrically insulated from the first gate electrode; and
a current control part applying a current control signal to the second gate electrode according to the period,
wherein the current control part comprises a first switching element including:
a source electrode receiving the current control signal,
a drain electrode directly connected to the second gate electrode for outputting the first current control signal, and
a gate electrode receiving the first switching voltage.

2. The display apparatus of claim 1, further comprising a second switching element including:
a source electrode receiving a second current control signal;
a drain electrode electrically connected to the driving voltage output terminal; and
a gate electrode receiving a second switching voltage, the second switching voltage having a reverse phase to the first switching voltage.

3. The display apparatus of claim 2, wherein the second gate electrode comprises a transparent conductive material.

4. The display apparatus of claim 3, wherein the channel area comprises an amorphous silicon layer.

5. The display apparatus of claim 4, wherein the second current control signal is a ground voltage.

6. The display apparatus of claim 1, wherein the current control part further comprises a second switching element including:
a source electrode receiving a second current control signal;
a drain electrode, electrically connected to the second gate electrode, for outputting the second current control signal; and
a gate electrode receiving a second switching voltage, the second switching voltage having a reverse phase to the first switching voltage.

7. The display apparatus of claim 6, wherein the second gate electrode comprises a transparent conductive material.

8. The display apparatus of claim 7, wherein the channel area comprises an amorphous silicon layer.

9. The display apparatus of claim 8, wherein the second current control signal is a ground voltage.

10. The display apparatus of claim 9, wherein the TFT is formed in a display area, and the current control part is formed in a peripheral area.

11. The display apparatus of claim 10, further comprising:
a gate line electrically connected to the gate electrode of the TFT;
a data line electrically connected to the source electrode of the TFT; and
a pixel electrode electrically connected to the drain electrode of the TFT,
wherein the first switching voltage is a gate voltage applied to the gate line.

12. The display apparatus of claim 11, wherein the first signal is a data voltage applied to the data line.

13. The display apparatus of claim 2, further comprising a switching element including:
   a source electrode to which a second signal is applied;
   a drain electrode electrically connected to the driving voltage output signal; and
   a gate electrode receiving the second switching voltage.

14. The display apparatus of claim 13, wherein the second gate electrode comprises a transparent conductive material.

15. The display apparatus of claim 14, wherein the channel area comprises an amorphous silicon layer.

16. The display apparatus of claim 15, wherein the second current control signal is a ground voltage.

17. The display apparatus of claim 13, wherein the TFT and the current control part are formed in a peripheral area.

18. The display apparatus of claim 17, further comprising:
   a gate line;
   a data line substantially perpendicular to the gate line; and
   a pixel electrode formed in an area where the gate line and the data line cross each other,
   wherein the output terminal is electrically connected to the gate line, for applying a gate voltage to the gate line.

19. The display apparatus of claim 18, wherein the first signal is a turn-on voltage of the gate voltage.

20. The display apparatus of claim 18, wherein the second signal is a turn-off voltage of the gate voltage.

21. A display apparatus comprising a driving part comprising:
   a signal control part for processing a control signal, the control signal processing a display signal and switching a pixel;
   a pull-up circuit for receiving the control signal from the signal control part and outputting a signal in a pull-up part;
   a pull-down circuit for receiving the control signal from the signal control part and outputting a signal in a pull-down part; and
   a current control part for controlling a current of the pull-up circuit,
   wherein the pull-up circuit comprises a TFT comprising:
   a source electrode receiving a first signal;
   a drain electrode electrically connected to a driving voltage output terminal;
   a first gate electrode receiving a first switching voltage, the first switching voltage having a constant period;
   a channel area formed between the source electrode and the drain electrode; and
   a second gate electrode electrically insulated from the first gate electrode,
   wherein the current control part applies a current control signal directly to the second gate electrode, and the current control signal has substantially the same period as the period of the first switching voltage,
   wherein the current control part comprises a switching element comprising:
   a source electrode receiving a first current control signal;
   a drain electrode, electrically connected to the second gate electrode, for outputting the first current control signal; and
   a gate electrode receiving the first switching voltage.

22. The display apparatus of claim 21, wherein the pull-down circuit further comprises a TFT comprising:
   a source electrode receiving a second signal;
   a drain electrode electrically connected to the driving voltage output terminal;
   a gate electrode receiving a second switching voltage, the second switching voltage having a reverse phase to the first switching voltage.

23. The display apparatus of claim 22, wherein the current control part comprises a switching element comprising:
   a source electrode receiving a second current control signal;
   a drain electrode, electrically connected to the second gate electrode, for outputting the second current control signal; and
   a gate electrode receiving the second switching voltage.

24. The display apparatus of claim 23, wherein the second gate electrode comprises a transparent conductive material.

25. The display apparatus of claim 24, wherein the channel area comprises an amorphous silicon layer.

26. The display apparatus of claim 25, wherein the second current control signal is a ground voltage.

27. The display apparatus of claim 26, wherein the driving part is formed in a peripheral area.

28. The display apparatus of claim 27, further comprising:
   a gate line;
   a data line substantially perpendicular to the gate line; and
   a pixel electrode formed in an area where the gate line and the data line cross each other,
   wherein the output terminal is electrically connected to the gate line and applies the gate voltage to the gate line.

29. The display apparatus of claim 28, wherein the first signal is a turn-on voltage of the gate voltage.

30. The display apparatus of claim 29, wherein the second signal is a turn-off voltage of the gate voltage.

* * * * *